(12) United States Patent
Pergande et al.

(10) Patent No.: US 9,004,564 B2
(45) Date of Patent: Apr. 14, 2015

(54) WAFER HANDLING APPARATUS

(71) Applicant: Varian Semiconductor Equipment Associates, Inc., Gloucester, MA (US)

(72) Inventors: Paul E. Pergande, Austin, TX (US); Charles T. Carlson, Cedar Park, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/800,768

(22) Filed: Mar. 13, 2013

(65) Prior Publication Data

US 2014/0265392 A1    Sep. 18, 2014

(51) Int. Cl.
   *B66F 19/00*    (2006.01)
   *B25J 15/00*    (2006.01)

(52) U.S. Cl.
   CPC .................................. *B25J 15/0014* (2013.01)

(58) Field of Classification Search
   USPC .............. 294/213, 183, 65, 87.1, 902, 119.1; 414/936, 941, 758, 752.1, 744.5; 901/36
   See application file for complete search history.

(56) References Cited

U.S. PATENT DOCUMENTS

| | | | |
|---|---|---|---|
| 5,700,046 A * | 12/1997 | Van Doren et al. | 294/119.1 |
| 6,918,735 B2 * | 7/2005 | Urban et al. | 414/729 |
| 7,641,247 B2 | 1/2010 | Blonigan et al. | |
| 8,276,959 B2 * | 10/2012 | Kim | 294/183 |
| 8,465,072 B2 * | 6/2013 | Wu et al. | 294/213 |
| 2004/0113444 A1 * | 6/2004 | Blonigan et al. | 294/1.1 |
| 2006/0125260 A1 * | 6/2006 | Chae et al. | 294/119.1 |
| 2011/0108742 A1 | 5/2011 | Weaver et al. | |

FOREIGN PATENT DOCUMENTS

| | | |
|---|---|---|
| JP | 2009-141091 A | 6/2009 |
| KR | 2012-0100026 A | 9/2012 |
| KR | 2012-0137004 A | 12/2012 |
| WO | 2010-017340 A2 | 2/2010 |

OTHER PUBLICATIONS

International Search Report and Written Opinion, mailed Aug. 22, 2014 for PCT Application PCT/US2014/023456 filed Mar. 11, 2014.

* cited by examiner

*Primary Examiner* — Stephen Vu

(57) ABSTRACT

Disclosed is a wafer support and alignment apparatus. The wafer support and alignment apparatus includes a wafer support component adapted to seat, align and support a wafer. The wafer support component includes at least one flat portion to support the wafer, at least one alignment lip portion protruding upward from the at least one flat portion, and at least one recessed pocket carved out of a portion of the at least one base portion. The at least one recessed pocket is adapted to receive at least one pad.

15 Claims, 6 Drawing Sheets

100

300

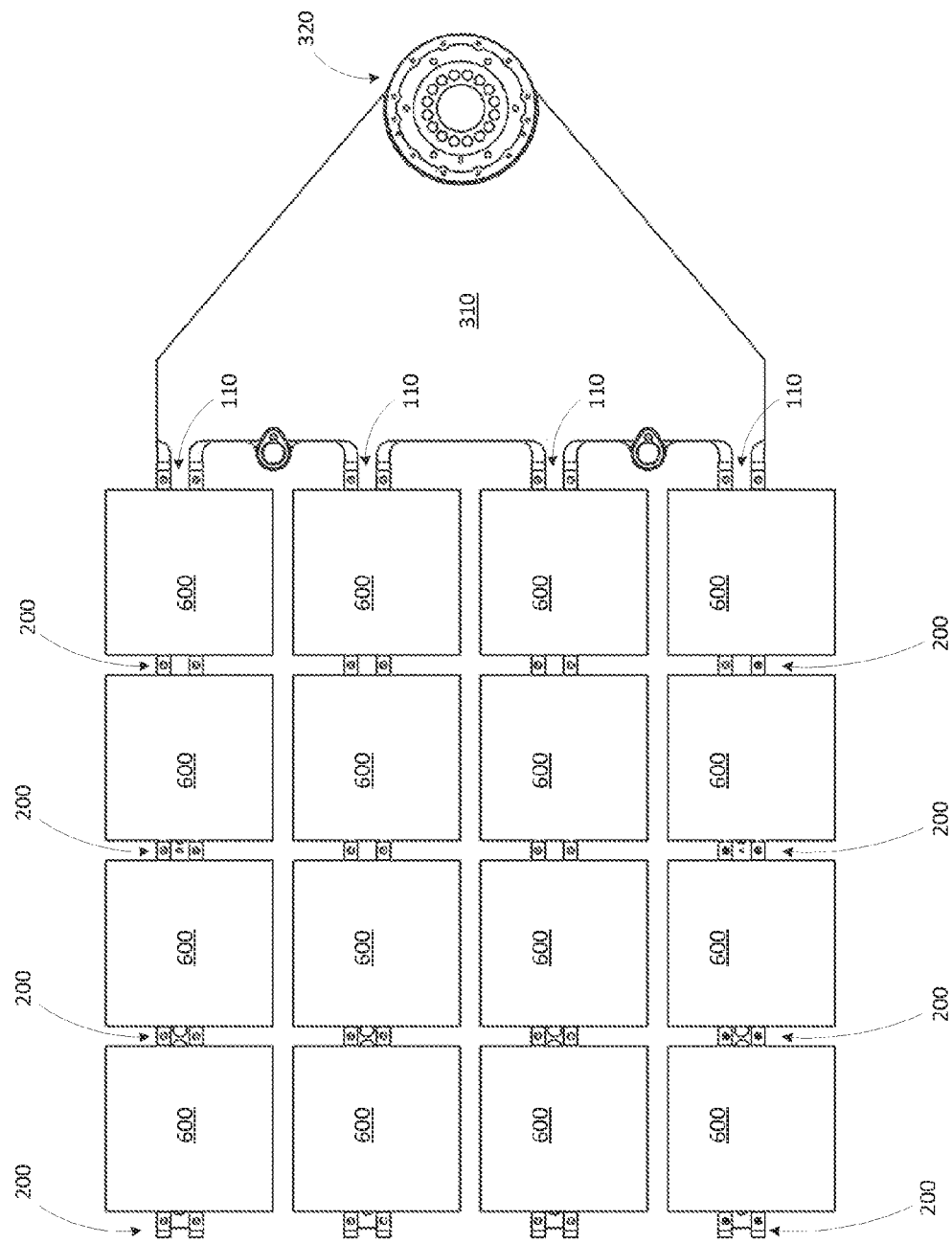

US 9,004,564 B2

WAFER HANDLING APPARATUS

BACKGROUND OF THE INVENTION

1. Field of the Invention

Embodiments of the invention relate to the field of semiconductor device fabrication. More particularly, the present invention relates to a wafer handling apparatus used to transport wafer materials among devices.

2. Discussion of Related Art

Silicon wafers are used in semiconductor and solar cell fabrication. The wafers are subjected to a multi-step manufacturing process that may involve a plurality of machines and a plurality of stations. Thus, the wafers need to be transported from one machine/station to another machine/station one or more times.

The transport of the wafers typically employs apparatuses called end effectors. A typical end effector may be hand-like in appearance where a base unit may attach to a plurality of finger-like extensions. On each of the finger-like extensions, a plurality of wafers may be seated atop wafer pads at spaced apart intervals. The end result may be a matrix of wafers supported by the plurality of end effector fingers. The end effector may typically be moved linearly (e.g., forward and backward) as well as rotationally all in the same plane (e.g., x-y axis). The end effector may also be moved in a third direction along a z-axis to provide a full range of motion.

There are several styles of wafer interface features used in semiconductor wafer handling equipment. Sometimes silicone pads are used to isolate the silicon wafer from the metallic robot end effector fingers. Sometimes semiconductor wafers sit on hard slippery pads affixed at periodic intervals along the end effector fingers. The hard slippery pads are typically made of a polyetheretherketone (PEEK) plastic which is a high performance thermoplastic material comprised of a polymer that is semi-crystalline. PEEK plastic is advantageous in that it retains its mechanical properties at extremely high temperatures, is weldable, machinable, and can be bonded with epoxies cyanoacrylates, polyurethanes, or silicones. PEEK also does not outgas under vacuum and is a generally acceptable material allowed to touch semiconductor wafers.

There are several styles of wafer interface features used in wafer handling equipment. Sometimes silicone pads are used in wafer handling equipment to separate the silicon wafer from a typically metallic robot end effector finger. If the silicon wafer were contacted by a metallic end effector finger, the wafer could be contaminated with the parent metal of the end effector finger. A recent development in wafer handling includes a typically hard polymer pad (e.g., PEEK) having a lip formed thereon. The wafer sits on the pad and is pushed against the lip as the end effector apparatus is accelerated or decelerated into position. The lip on the pad is used to align the wafer with respect to the end effector and ensure proper wafer alignment when the wafer is delivered to a process station. If such a hard polymer pad supporting a wafer along an end effector finger is rotated too rapidly, the wafer can slip sideways off the end effector apparatus. Wafers on hard polymer pads can also slip during linear motion events when the end effector vibrates or the robot control system is not tuned properly causing the end effector fingers to also vibrate.

SUMMARY OF THE INVENTION

The embodiments disclosed and claimed herein are an improvement to the art and describe a system and apparatus to keep silicon wafers aligned and in place to prevent slippage during linear and rotational movement of a robotic end effector apparatus tasked with moving the silicon wafers from station to station during fabrication processing. In an embodiment there is disclosed a wafer support and alignment apparatus. The wafer support and alignment apparatus includes a wafer support component adapted to seat, align and support a wafer. The wafer support component includes at least one flat portion to support the wafer, at least one alignment lip portion protruding upward from the at least one flat portion, and at least one recessed pocket carved out of a portion of the at least one base portion. The at least one recessed pocket is adapted to receive at least one pad.

In another embodiment, there is disclosed a wafer support and alignment apparatus. The wafer support and alignment apparatus includes a wafer support component adapted to seat, align and support a wafer. The wafer support component includes at least one flat portion to support the wafer, at least one alignment lip portion protruding upward from the at least one flat portion, and at least one recessed pocket carved out of a portion of the at least one base portion. The at least one recessed pocket is adapted to receive at least one pad. The base portion is adapted to receive the wafer support component. The base portion is further adapted to attach to an end effector apparatus.

BRIEF DESCRIPTION OF THE DRAWINGS

FIG. 6A illustrates a top view of one embodiment of an end effector apparatus having a plurality of wafers positioned between a plurality of wafer support and alignment apparatuses.

DESCRIPTION OF EMBODIMENTS

Figure 1:
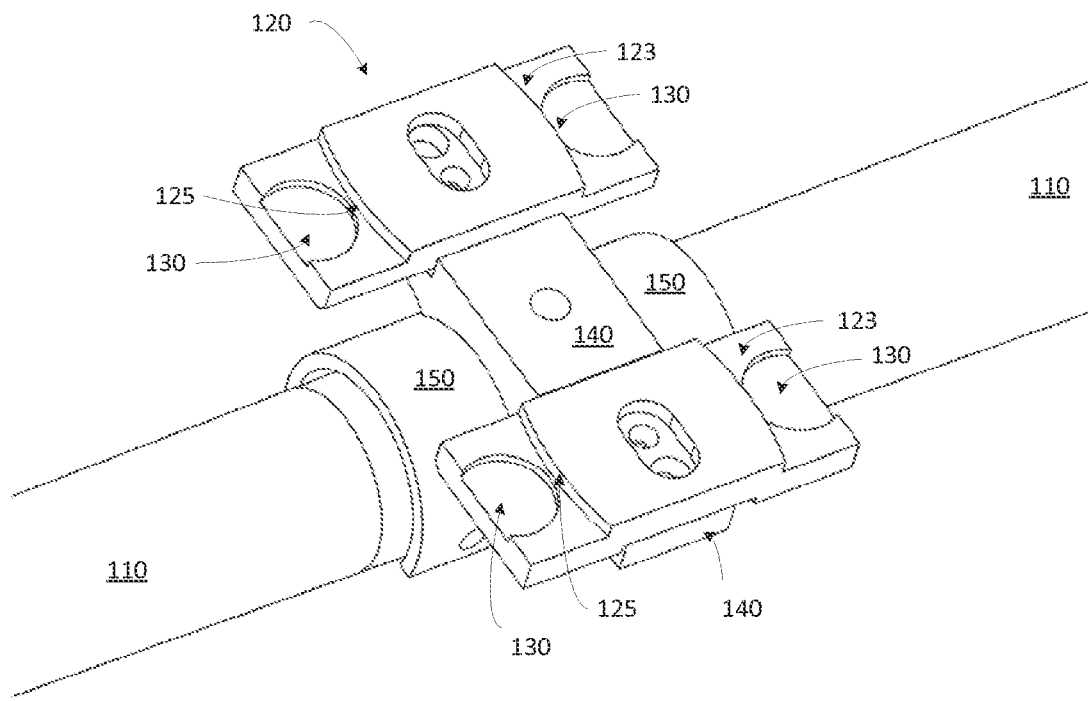
FIG. 1 is an illustration of one embodiment of a wafer support and alignment apparatus.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is an illustration of one embodiment of a wafer support and alignment apparatus 100. The wafer support and alignment apparatus 100 includes a wafer support component 120 that is removably attachable to a component support piece 140. The component support piece 140, in turn, may be affixed to or removably attached to an end effector apparatus—specifically to an end effector finger 110. The end effector finger 110 is typically made from metal for strength, rigidity, and resonance so as to perform satisfactorily during its operation of transporting wafers from station to station in a manufacturing process. The metal, however, needs to be shielded from the semiconductor wafers it is tasked with transporting because the metal may contaminate the semiconductor wafer and change the desired properties of the wafer. Thus, the wafer support and alignment apparatus 100 may be comprised of a polymer material, such as, for instance, polyetheretherketone (PEEK) or silicone. The wafer support component 120 and component support piece 140 may be comprised of solar compatible materials such as PEEK or other polymers, metals, ceramics, or glass.

The wafer support component 120 may be removably attachable to the component support piece 140 using a snap-fit or threaded coupling in which the wafer support component 120 fits snugly about the component support piece 140 but may still be removed and replaced if necessary.

The wafer support component 120 further includes a flat portion 123 upon which a wafer (or portion thereof) may be seated. The wafer support component 120 also includes an alignment lip portion 125 that protrudes or extends upward normal to the flat portion 123. The alignment lip portion 125 is operative to provide a stop for a seated wafer especially when the wafer support component and alignment apparatus 100 is in motion. The alignment lip portion 125 may have a slight curvature to assist in wafer placement in which the peak or apex point of the curvature may be characterized as the alignment point when used in conjunction with other wafer support component(s) 120 of other wafer support and alignment apparatuses 100. For example, more than one alignment apparatus 100 may be placed on a particular end effector finger 110 and a wafer may be placed between two of these alignment apparatuses 100.

The alignment lip portion 125 is operative to align the wafers supported by the wafer support component by working in conjunction with other wafer support component(s) 120 of other wafer support and alignment apparatuses 100. The alignment lip portion(s) 125 of the other wafer support component(s) 120 are all aligned such that the wafers align themselves when in contact with the alignment lip portion(s) 125. This is shown more clearly in FIGS. 5-6 as will be discussed later.

The wafer support component 120 further includes a recessed pocket area 130 that may be carved out of a sub-portion of the flat portion 123. The recessed pocket area 130 is operative to receive and seat a pad. The component support piece 140 includes a base portion 150. The base portion 150 is adapted to attach to the end effector finger 110 as described above. For instance, the end effector finger 110 may be rounded in shape. If so, the base portion 150 may be similarly rounded with a slightly larger radius so as to fit snugly over the end effector finger 110. This is but one example of an end effector finger 110 shape. Other shapes may be employed by the end effector finger(s) 110 to which the base portion 150 may be adapted to couple either permanently or removably.

Figure 2:
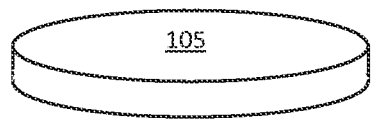
FIG. 2 is an illustration of one embodiment of a pad for use with the wafer support and alignment apparatus of FIG. 1A.

FIG. 2 is an illustration of one embodiment of a pad 105 for use with the wafer support and alignment apparatus 100 of FIG. 1A. As mentioned earlier, the pad 105 may be seated within the recess pocket 130 of the wafer support component 120. The recessed pocket 130 and pad 105 have been shown to be circular in shape. This is but one example or embodiment. Other complementary shapes for the recessed pocket 130 and pad 105 may be implemented.

The pad 105 may be comprised of silicone based on the combination of non-contamination to a wafer and coefficient of friction between the pad 105 and the wafer. Silicone has a coefficient of friction of approximately 0.25 to 0.75. Moreover, the surface texture of the pad 105 may be altered to affect the coefficient of friction as well. For instance, the surface area of pad 105 may be textured similar to sandpaper to increase the coefficient of friction. Thus, the choice of material and texture pattern of the pad surface affect the overall coefficient of friction between the pad 105 and the wafer. This results in a 'tunable' apparatus in which greater coefficients of friction may be applied to areas where the wafers experience greater forces while in motion. Thus, the pads 105 at one location or end of an end effector apparatus, such as the end effector apparatus 500 of FIG. 5, may have different coefficients of friction than at a different location or end. For examples, pads 105 at opposite ends of a length of an end effector may have different or varying coefficients of friction. The pads 105 of an end effector apparatus also may have varying coefficients of friction along a particular dimension, which may be, for example, in a gradient along a length from one location or end to another location or end. Using embodiments disclosed herein, an end effector may have pads with two or more different coefficients of friction. For example, each wafer, half of the wafers, or each wafer in a particular row held by an end effector may be on pads with different coefficients of friction. In addition, the pad 105 may be comprised of other solar compatible materials such as PEEK or other polymers, ceramics, glass, or metals that do not contaminate the wafer.

The pad 105, when seated within the recessed pocket 130 protrudes slightly above the flat portion 123 of the wafer support component 120. This is so that a wafer that is seated on the flat portion 123 will actually contact the pad 105. In addition, the pad, when seated, is designed so as not to raise a seated wafer above the alignment lip portion 125. The pad 105 has a primary function of maintaining wafer position throughout operation of an end effector apparatus that moves the seated wafers from station to station. The transportation via the end effector may cause lateral forces to be applied to the wafers. If the wafers slip out of their expected positions it can hinder the manufacturing process. Thus, the pad 105 may be comprised of a material having a desired coefficient of friction. One such material may be silicone. The coefficient of friction for the pad may be greater than or less than the coefficient of friction for the flat portion 123 of the wafer support component 120.

Moreover, the coefficient of friction for the pad 105 may be varied for different wafer support and alignment apparatuses 100. For instance, the forces applied to a plurality of wafers seated on an end effector finger 110 may increase as the wafer is situated further out along the end effector finger 110. This is especially true if there is a rotational component to the movement of the end effector apparatus. The rotational forces further away from a base of the end effector apparatus (i.e., where the end effector fingers 110 couple with the rest of the end effector apparatus) are greater than the rotational forces closer to the base of the end effector apparatus. Thus, a pad 105 having a higher coefficient of friction may be used for wafer support components 120 attached to the end effector finger 110 further away from the base of the end effector apparatus. The coefficients of friction for the pads may be chosen and implemented on the pads based on the expected linear, rotational, and vibration forces the end effector apparatus will impart to the wafers. The pad 105 may be adhered within the recessed pocket 130 to keep it in place using a pressure sensitive adhesive, an epoxy, or other fastening mechanism.

Figure 3:
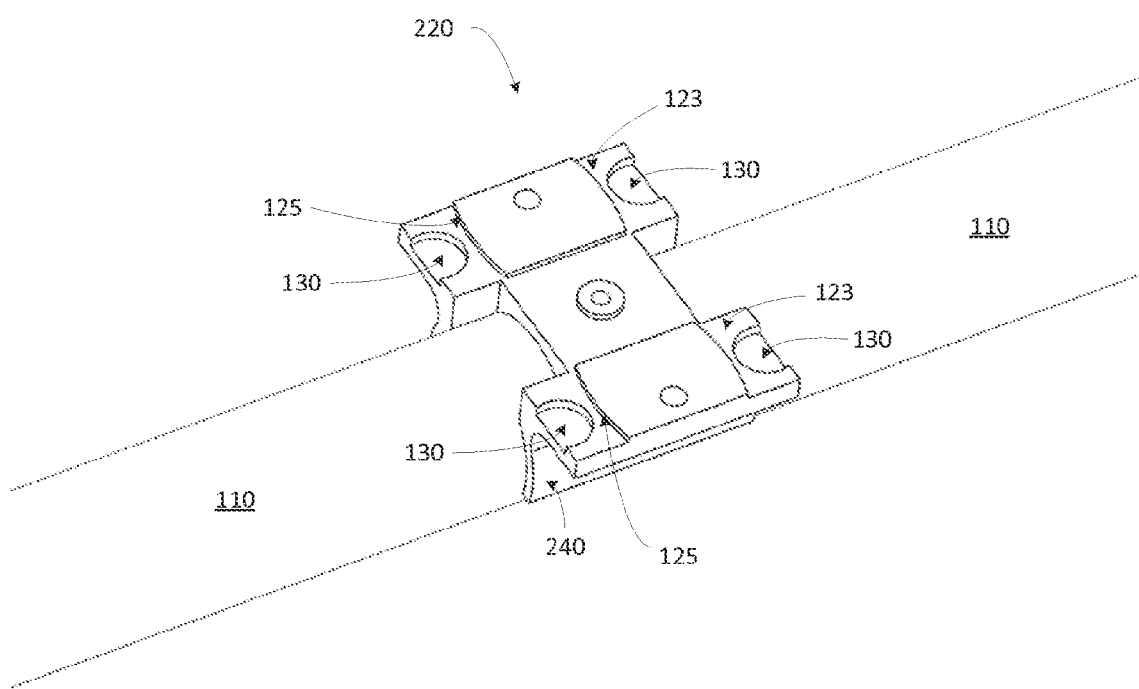
FIG. 3 is an illustration of another embodiment of a wafer support and alignment apparatus.

FIG. 3 is an illustration of another embodiment of a wafer support and alignment apparatus 300. Components and features identical to those in FIG. 1A have retained the same reference numbers. Components and features different to those in FIG. 1A have been identified with new reference numbers. The wafer support and alignment apparatus 300 includes a wafer support component 220. The wafer support component 220 may be affixed to or removably attached to an end effector apparatus—specifically to an end effector finger 110. The wafer support and alignment apparatus 300 is also comprised of a polymer material, such as, for instance, PEEK.

The wafer support component 120 further includes a flat portion 123 upon which a wafer (or portion thereof) may be seated. The wafer support component 220 also includes an alignment lip portion 125 that protrudes or extends upward normal to the flat portion 123. The alignment lip portion 125 is operative to provide a stop for a seated wafer especially when the wafer support component and alignment apparatus 300 is in motion. The alignment lip portion 125 may have a slight curvature to assist in wafer placement in which the peak or apex point of the curvature may be characterized as the alignment point when used in conjunction with other wafer support component(s) 220 of other wafer support and alignment apparatuses 300.

The alignment lip portion 125 is operative to align the wafers supported by the wafer support component by working in conjunction with other wafer support component(s) 220 of other wafer support and alignment apparatuses 300. The alignment lip portion(s) 125 of the other wafer support component(s) 220 are all aligned such that the wafers align themselves when in contact with the alignment lip portion(s) 125. This is shown more clearly in FIGS. 6A, 6B as will be discussed later. The wafer support component 220 further includes a recessed pocket area 130 that may be carved out of a sub-portion of the flat portion 123. The recessed pocket area 130 is operative to receive and seat a pad, such as the pad 105 of FIG. 1A.

The wafer support component 220 includes a base coupling portion 150. The base coupling portion 240 descends from the wafer support component 220 and is adapted to attach about the end effector finger 110. For instance, the end effector finger 110 may be rounded in shape. If so, the base coupling portion 240 may be similarly rounded with a slightly larger radius so as to fit snugly about the end effector finger 110. This is but one example of an end effector finger 110 shape. Other shapes may be employed by the end effector finger(s) 110 to which the base coupling portion 240 may be adapted to couple either permanently or removably.

Figure 4:
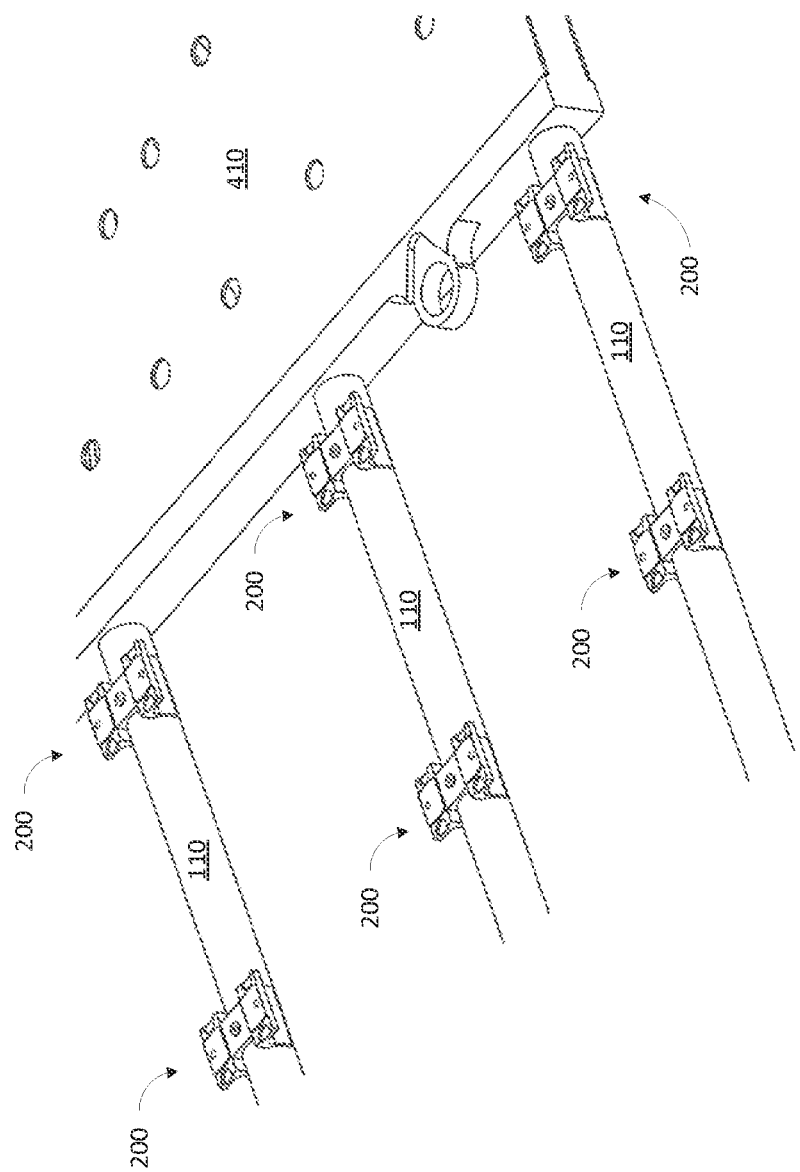
FIG. 4 illustrates a partial perspective view of one embodiment of an end effector apparatus having a plurality of wafer support and alignment apparatuses attached thereon.

FIG. 4 illustrates a partial perspective view of one embodiment of an end effector apparatus 400 having a plurality of wafer support and alignment apparatuses 200 attached thereon. The end effector apparatus 400 is partially shown and includes a base portion 410 and a plurality of end effector fingers 110. Each end effector finger 110 includes a plurality of wafer support component and alignment apparatuses 300 attached thereon. Although alignment apparatus 300 is illustrated for ease of explanation, each of the wafer support component and alignment apparatuses has been specifically positioned for alignment purposes as will become more evident in FIGS. 5-6.

Figure 5:
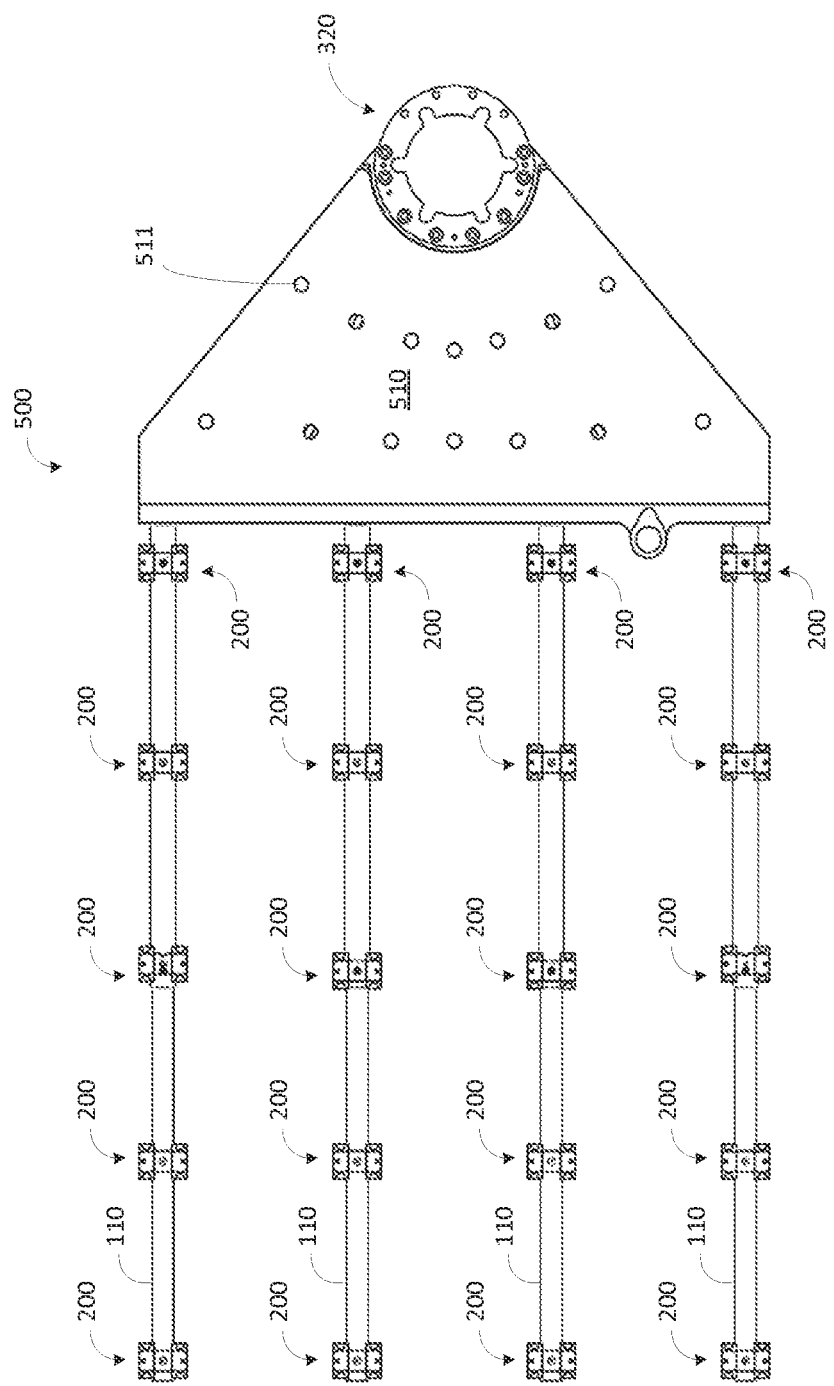
FIG. 5 illustrates a top view of one embodiment of an end effector apparatus having a plurality of wafer support and alignment apparatuses attached thereon.

FIG. 5 illustrates a top view of one embodiment of an end effector apparatus 500 having a plurality of wafer support and alignment apparatuses 200 attached thereon. In this top view, the end effector apparatus 500 is shown more completely and includes the base portion 510 having a plurality of holes 511 and an end effector apparatus coupling mechanism 320 operative to couple the end effector apparatus 500 to a source of motion that is not shown. For instance, the source of motion may be a robotic arm having a full range of linear and rotational motion in a two dimensional plane (e.g., x-y axis) and a third linear component of motion in the z-axis.

The wafer support component and alignment apparatuses 200 may be spaced apart along each end effector finger 110 in an aligned orientation to receive and seat a respective one of a plurality of wafers. As will be shown in FIG. 6, a portion of each individual wafer may be seated on multiple wafer support components 220 (shown in FIG. 3) of multiple wafer support component and alignment apparatuses 200.

FIG. 6A illustrates the same top view of the end effector apparatus 500 shown in FIG. 5 having a plurality of wafers 600 positioned atop and between a plurality of wafer support and alignment apparatuses 200. In this top view, each of the plurality of wafers 600 is shown seated on a respective one of a plurality of wafer support and alignment apparatuses 200. Each wafer 600 is associated with a single end effector finger 110. A plurality of wafers 600 are spaced apart and positioned along the length of each end effector finger 110 to form a row. Each wafer 600 rests upon two wafer support and alignment apparatuses 200. In addition, each wafer support and alignment apparatus 200, as illustrated in FIG. 2A, includes four flat portions 123, four recess pockets 130 and four alignment lip portions 125 operatively arranged in pairs: a front facing side by side pair and a rear facing side by side pair. The side by side front and rear facing pairs each straddle the end effector finger 110. While not shown, a pad 105 may be seated within each of the recessed pockets 130 to control the coefficient of friction between each wafer 600 and the wafer support and alignment apparatuses 200. Each wafer 600 may rest upon a rear facing pair of one wafer support and alignment apparatuses 200 and a front facing pair of the next wafer support and alignment apparatuses 200 along the end effector finger 110. The wafers 600 are aligned to either the front or rear sets of alignment lip portions 125, not both. The wafers 500 are positioned against alignment lip portions 125 because there is a small gap on the other side of each wafer 600 between it and the opposite alignment lip portion 125. In this manner, each of the wafers 600 rest on four (4) surfaces 123 or on pads 105. In this arrangement, a wafer 600 may contact four pads 105 operative to align the wafers 600 and keep the wafers in place during motion of the end effector apparatus 300. The wafers 600 may want to ride between the alignment lip portions 125 when the end effector apparatus 500 is in motion. The pads 105, however, serve to reduce any movement of the wafers 600 based on the coefficient of friction between the pads 105 and the wafers 600. This arrangement is repeated for each of the end effector fingers 110 to produce a matrix of wafers 600 that can be reliably and efficiently moved with less chance of a wafer 600 slipping out of alignment.

Figure 6B:
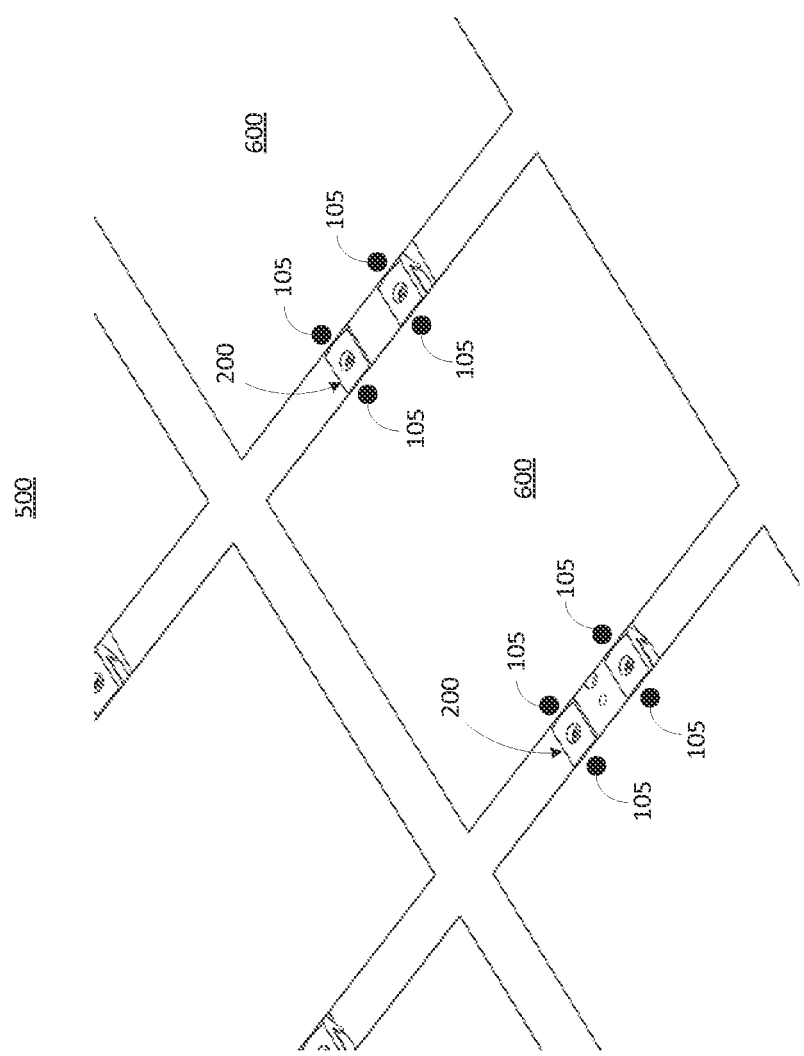
FIG. 6B illustrates a more detailed partial perspective view of one embodiment of an end effector apparatus having a wafer positioned between a plurality of wafer support and alignment apparatuses.

FIG. 6B illustrates a more detailed partial perspective view of one embodiment of an end effector apparatus 500 having a wafer 600 positioned between a plurality of wafer support and alignment apparatuses 200. In this view, a wafer 600 is shown seated upon four pads 105 (under the wafer 600) and aligned using the alignment lip portion 125 of the wafer support components 220 of the wafer support and alignment apparatuses 200. The wafer 600 is essentially resting upon the pads 105 and is not attached in any other manner. Thus, the forces of friction are the only forces keeping the wafer 600 in place when external lateral, rotational or vibration forces are applied to the wafer 600 during transport. The combination of the alignment lip portions 125 and the pads 105 serve to keep each of the plurality of wafers 600 in place during transport of the wafers 600 from station to station in the manufacturing process.

The embodiments presented herein provide an improvement over existing designs. A higher coefficient of friction between the wafer and the end effector can be achieved using the silicone pads while retaining the alignment features. Moreover, each wafer position could have a pad 105 with a different coefficient of friction optimized to resist the acceleration and rotational forces a wafer 600 will experience since the forces on each wafer position may be different. For instance, the wafer positions further out on an end effector finger 110 may experience greater rotational forces than wafer positions closer to the base 510 of the end effector apparatus 500. Providing these wafer positions with a greater coefficient of friction can keep them as stable as the other wafer positions.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof

What is claimed is:

1. A wafer support and alignment apparatus comprising:
    a wafer support component adapted to seat, align and support a wafer, the wafer support component including:
        at least one flat portion to support the wafer;
        at least one alignment lip portion protruding upward from the at least one flat portion, wherein the at least one alignment lip portion is curved such that its outermost point corresponds with an alignment point for the wafer seated on the at least one flat portion; and
        at least one recessed pocket carved out of a portion of the at least one flat portion, the at least one recessed pocket adapted to receive at least one pad; and
    a base adapted to receive the wafer support component, the base further adapted to attach to an end effector apparatus.

2. The wafer support and alignment apparatus of claim 1, wherein the wafer support component is comprised of polyetheretherketone (PEEK) plastic and the at least one pad is comprised of silicone.

3. The wafer support and alignment apparatus of claim 1, wherein the at least one pad has a higher coefficient of friction than the flat portion of the wafer support component.

4. The wafer support and alignment apparatus of claim 1, wherein the at least one pad has a lower coefficient of friction than the flat portion of the wafer support component.

5. The wafer support and alignment apparatus of claim 1, wherein the end effector apparatus includes a plurality of fingers, each of the fingers having a plurality of bases attached along a length of the finger, wherein a coefficient of friction for the at least one pad associated with the plurality of bases varies along the length of the finger.

6. A wafer support and alignment apparatus comprising:
    a wafer support component adapted to seat, align and support a wafer, the wafer support component including:
        at least one flat portion to support the wafer;
        at least one alignment lip portion protruding upward from the at least one flat portion; and
        at least one recessed pocket carved out of a portion of the at least one base portion, the at least one recessed pocket adapted to receive at least one pad; and
    a descending portion adapted to attach with an end effector apparatus, wherein the end effector apparatus includes a plurality of fingers, each of the fingers having a plurality of wafer support components attached along a length of the finger, wherein a coefficient of friction for the at least one pad associated with the plurality of wafer support components varies along the length of the finger.

7. The wafer support and alignment apparatus of claim 6, wherein the wafer support component is comprised of polyetheretherketone (PEEK) plastic and the at least one pad is comprised of silicone.

8. The wafer support and alignment apparatus of claim 6, wherein the at least one alignment lip portion is curved such that its outermost point corresponds with an alignment point for the wafer seated on the at least one flat portion.

9. The wafer support and alignment apparatus of claim 6, wherein the at least one pad has a higher coefficient of friction than the flat portion of the wafer support component.

10. The wafer support and alignment apparatus of claim 6, wherein the at least one pad has a lower coefficient of friction than the flat portion of the wafer support component.

11. A wafer support and alignment apparatus comprising:
    a wafer support component adapted to seat, align and support a wafer, the wafer support component including:
        at least one flat portion to support the wafer;
        at least one alignment lip portion protruding upward from the at least one flat portion, wherein the at least one alignment lip portion is curved such that its outermost point corresponds with an alignment point for the wafer seated on the at least one flat portion; and
        at least one recessed pocket carved out of a portion of the at least one base portion, the at least one recessed pocket adapted to receive at least one pad.

12. The wafer support and alignment apparatus of claim 11, wherein the wafer support component is comprised of polyetheretherketone (PEEK) plastic and the at least one pad is comprised of silicone.

13. The wafer support and alignment apparatus of claim 11, wherein the at least one pad has a higher coefficient of friction than the flat portion of the wafer support component.

14. The wafer support and alignment apparatus of claim 11, wherein the at least one pad has a lower coefficient of friction than the flat portion of the wafer support component.

15. The wafer support and alignment apparatus of claim 11, wherein the wafer support component is adapted to attach to an end effector apparatus that includes a plurality of fingers, each of the fingers having a plurality of wafer support components attached along a length of the finger, wherein a coefficient of friction for the at least one pad associated with the plurality of wafer support components varies along the length of the finger.

* * * * *